(12) United States Patent  (10) Patent No.: US 8,431,833 B2
Kajihara  (45) Date of Patent: Apr. 30, 2013

(54) PRINTED WIRING BOARD AND METHOD FOR MANUFACTURING THE SAME

(75) Inventor: Kazuki Kajihara, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 352 days.

(21) Appl. No.: 12/645,791

(22) Filed: Dec. 23, 2009

(65) Prior Publication Data

US 2010/0163297 A1 Jul. 1, 2010

Related U.S. Application Data

(60) Provisional application No. 61/141,147, filed on Dec. 29, 2008.

(51) Int. Cl.
*H05K 1/11* (2006.01)

(52) U.S. Cl.
USPC ........... 174/264; 174/262; 174/263; 174/265; 174/266

(58) Field of Classification Search .......... 174/262–266; 361/792–795; 29/829, 846, 847
See application file for complete search history.

(56) References Cited

U.S. PATENT DOCUMENTS

| | | | | |
|---|---|---|---|---|
| 3,354,543 | A * | 11/1967 | Lawrence et al. | 29/853 |
| 3,499,821 | A | 3/1970 | Zinbarg | |
| 5,785,789 | A * | 7/1998 | Gagnon et al. | 156/235 |
| 6,365,844 | B2 * | 4/2002 | Nishii et al. | 174/264 |
| 6,591,495 | B2 * | 7/2003 | Hirose et al. | 29/846 |
| 6,998,540 | B2 * | 2/2006 | Belke et al. | 174/263 |
| 2002/0085888 | A1 * | 7/2002 | Velpari et al. | 408/1 R |
| 2006/0021794 | A1 * | 2/2006 | Cheng | 174/264 |
| 2006/0065534 | A1 * | 3/2006 | Nakai et al. | 205/118 |
| 2006/0223307 | A1 * | 10/2006 | Gotoh et al. | 438/640 |
| 2007/0074904 | A1 * | 4/2007 | Kohara et al. | 174/262 |
| 2007/0199733 | A1 * | 8/2007 | Murai et al. | 174/250 |
| 2007/0240901 | A1 * | 10/2007 | Okamoto et al. | 174/262 |

FOREIGN PATENT DOCUMENTS

| | | |
|---|---|---|
| JP | 2-194689 | 8/1990 |
| JP | 2002-151844 | 5/2002 |
| JP | 2003-218519 | 7/2003 |
| JP | 2004-288795 | 10/2004 |
| JP | 2004-311919 | 11/2004 |
| JP | 2004-335655 | 11/2004 |
| JP | 2005-086164 A | 3/2005 |
| JP | 2007-227809 | 9/2007 |

* cited by examiner

*Primary Examiner* — Timothy Thompson
*Assistant Examiner* — Sherman Ng
(74) *Attorney, Agent, or Firm* — Oblon, Spivak, McClelland, Maier & Neustadt, L.L.P.

(57) ABSTRACT

A printed wiring board includes a substrate having a first surface, a second surface on the opposite side of the first surface and a through-hole extending between the first and second surfaces, a first conductive circuit formed on the first surface of the substrate, a second conductive circuit formed on the second surface of the substrate, and a through-hole conductor filling the through-hole and connecting the first and second conductive circuits. The through-hole has a first opening portion tapering from the first surface toward the second surface and a second opening portion tapering from the second surface toward the first surface. The substrate is made of a resin and a reinforcing material portion in the resin. The reinforcing material portion has a protruding portion protruding into the through-hole at the intersection of the first and second opening portions. The protruding portion encroaches into the through-hole conductor.

20 Claims, 13 Drawing Sheets

PRINTED WIRING BOARD AND METHOD FOR MANUFACTURING THE SAME

CROSS-REFERENCE TO RELATED APPLICATIONS

The present application claims the benefits of priority to U.S. Application No. 61/141,147, filed Dec. 29, 2008. The contents of that application are incorporated herein by reference in their entirety.

BACKGROUND OF THE INVENTION

1. Field of the Invention

The present invention is related to a printed wiring board having a through-hole that penetrates an insulative substrate, and to a method for manufacturing such a wiring board; especially, to a printed wiring board in which the through-hole is filled with metal, and to a method for manufacturing such a wiring board.

2. Discussion of the Background

Japanese Laid-Open Patent Publication 2004-311919 describes technology (a method for filling through-holes) to avoid occurrence of voids or the like by configuring a through-hole having a cross-sectional shape resembling that of an hourglass. Such a through-hole configuration indicates a through-hole made up of a first opening tapering from the first surface of the substrate toward the second surface of the substrate and of a second opening tapering from the second surface of the substrate toward the first surface of the substrate. The first opening and the second opening are connected inside the substrate.

In such a through-hole filling method, as shown in FIG. 8A, through-hole 801 is first formed in insulative substrate 800. Next, as shown in FIG. 8B, seed layer 802 made of metal is formed on the inner-wall surface of through-hole 801. Then, electrolytic plating is performed to form plated-metal layer 803 by filling metal starting in the narrowest portion (the portion whose lateral cross-section is the smallest).

It is thought that when a reinforcing material protrudes from the wall surface of the resin as shown in FIG. 9A, the hole diameter (L1) of the opening which penetrates reinforcing materials (810a, 810b) could become smaller than the diameter (L2) of the narrowest portion of through-hole 801 that penetrates the resin. When a substrate is made of two layers of reinforcing material and resin, as shown in FIG. 9A, and when one reinforcing material (810a) is positioned between the first surface of the substrate and the middle section of the substrate and the other reinforcing material (810b) is positioned between the second surface (the surface opposite the first surface) and the middle section of the substrate, it is thought that areas penetrating reinforcing materials (810a, 810b) may be blocked by plating (electrolytic plated film) before the narrowest portion of through-hole 801 penetrating the substrate is filled. As shown in FIG. 9B, it is thought that there is a risk that void 811 occurs in the narrowest portion of through-hole 801 that penetrates the resin. The contents of this publication are incorporated herein by reference in their entirety.

SUMMARY OF THE INVENTION

According to one aspect of the present invention, a printed wiring board includes a substrate having a first surface, a second surface on the opposite side of the first surface and a through-hole extending between the first surface and the second surface, a first conductive circuit formed on the first surface of the substrate, a second conductive circuit formed on the second surface of the substrate, and a through-hole conductor filling the through-hole and connecting the first conductive circuit and the second conductive circuit. The through-hole has a first opening portion tapering from the first surface toward the second surface and a second opening portion tapering from the second surface toward the first surface. The substrate is made of a resin and a reinforcing material portion provided in the resin. The reinforcing material portion has a protruding portion protruding into the through-hole at the intersection of the first opening portion and the second opening portion. The protruding portion of the reinforcing material portion encroaches into the through-hole conductor.

According to another aspect of the present invention, a method for manufacturing a printed wiring board includes preparing a substrate made of a resin and a reinforcing material portion provided in the resin, forming a first opening portion tapering from a first surface of the substrate toward a second surface on the opposite side of the substrate, forming a second opening portion tapering from the second surface of the substrate toward the first surface such that the first opening portion and the second opening portion is connected to form a through-hole having the first opening portion and the second opening portion and the reinforcing material portion has a protruding portion protruding into the through-hole at the intersection of the first opening portion and the second opening portion, forming a through-hole conductor by filling the through-hole with a conductive material, and forming a first conductive circuit on the first surface of the substrate and a second conductive circuit on the second surface of the substrate such that the first conductive circuit and the second conductive circuit are connected by the through-hole conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
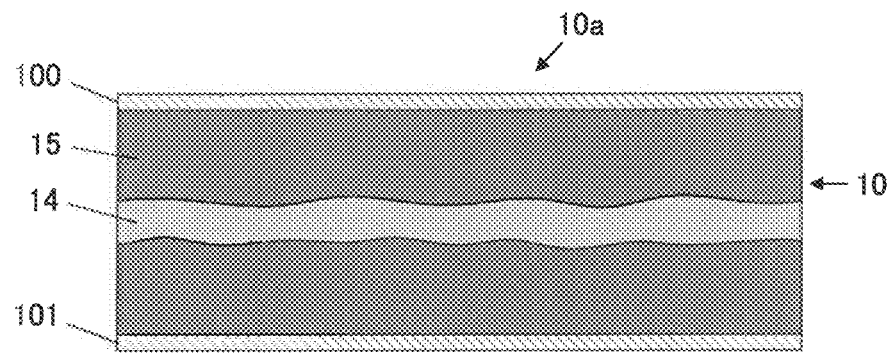
FIGS. 1A-1I are cross-sectional views showing the steps of manufacturing a printed wiring board according to Embodiment 1 of the present invention.

The embodiments will now be described with reference to the accompanying drawings, wherein like reference numerals designate corresponding or identical elements throughout the various drawings.

Embodiment 1

By referring to FIGS. 1A-1I, a method for manufacturing printed wiring board 1 of Embodiment 1 (see FIG. 2) is described.

First, as shown in FIG. 1A, copper-clad laminate (10a) is prepared by laminating copper foils 100, 101 with an approximate thickness of 12 μm on both main surfaces of insulative substrate 10 with a thickness of 0.1-0.6 mm. The thickness of insulative substrate 10 is preferred to be in the range of 0.3-0.4 mm. If the thickness is in such a range, the strength of the substrate may be ensured while it is easy to form through-holes shown in FIG. 1D using a laser. Insulative substrate 10 is made up of a sheet of reinforcing material 14 and cured resin 15. In the present embodiment, reinforcing material 14 is arranged substantially in the center of insulative substrate 10 in the direction of its thickness and substantially parallel to the main surfaces of insulative substrate 10.

As for a reinforcing material, glass cloth, glass non-woven cloth or aramid non-woven cloth may be used. Among such, from a strength point of view, a sheet type glass-cloth reinforcing material is preferred. The thickness of reinforcing material 14 is preferred to be in the range of 0.09-0.15 mm.

Here, a method is described for manufacturing a substrate in which the thickness of an insulative substrate is great relative to the thickness of a sheet of reinforcing material. First, a reinforcing material is impregnated with resin and dried. Then, resin is applied on both surfaces of the dried substrate. After that, the resin is cured and an insulative substrate is obtained with a greater thickness.

Figure 1B:
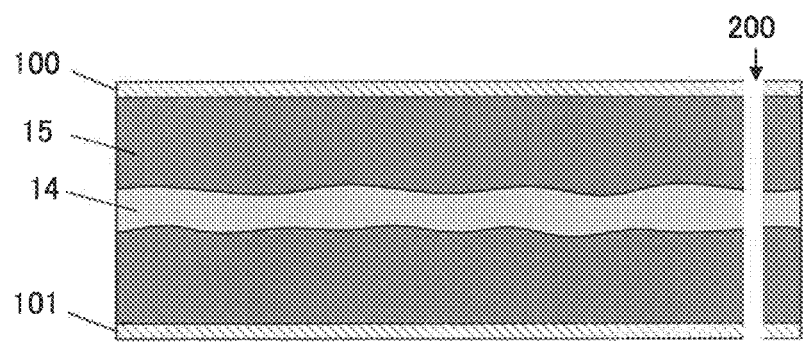

In the following, alignment mark 200 penetrating copper-clad laminate (10a) is formed (see FIG. 1B). Alignment mark 200 may be formed using a drill or a laser. Alignment mark 200 is preferred to be made substantially straight.

Next, by a black oxide treatment, copper foils 100, 101 of copper-clad laminate (10a) are oxidized.

Figure 1C:
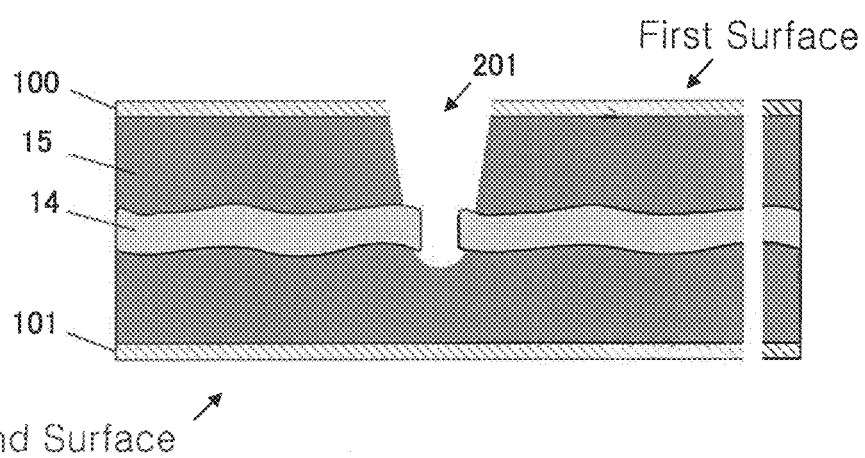

In the following, a laser is beamed at a predetermined spot on one main surface (first surface) of copper-clad laminate (10a) to form first opening 201 (see FIG. 1C). As for a laser, a carbon dioxide gas (CO2) laser, Nd-YAG laser, excimer laser or the like may be used.

First opening 201 tapers from the first surface of copper-clad laminate (10a) toward the second surface (the surface opposite the first surface). That is, first opening 201 becomes gradually narrower from the first surface of copper-clad laminate (10a) toward the second surface (the surface opposite the first surface). First opening 201 is formed based on alignment mark 200.

Figure 1D:
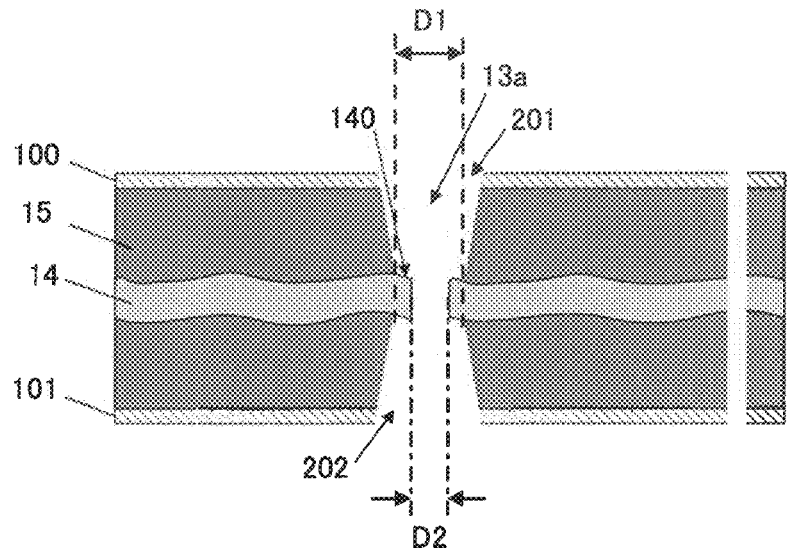

Then, a laser is beamed at a predetermined spot on the second surface of copper-clad laminate (10a) to form second opening 202 (see FIG. 1D). Second opening 202 tapers from the second surface of copper-clad laminate (10a) toward the first surface. Second opening 202 is also formed based on alignment mark 200. That is, second opening 202 becomes gradually narrower from the second surface of copper-clad laminate (10a) toward the first surface. Second opening 202 is also formed based on alignment mark 200.

Since first opening 201 and second opening 202 are formed based on the same alignment mark 200, precise alignment may be achieved.

In doing so, first opening 201 and second opening 202 are connected at a portion other than the first surface or the second surface of copper-clad laminate (10a) (inside copper-clad laminate (10a)). As a result, as shown in FIG. 1D, through-hole (penetrating hole) (13a), made up of first opening 201 and second opening 202, is formed.

As described above, copper-clad laminate (10a) contains reinforcing material 14. When resin and reinforcing material are compared, resin is usually easier to process than the reinforcing material. Accordingly, the opening diameter of a through-hole may tend to be the smallest where the reinforcing material is located. Also, since reinforcing material 14 is positioned at substantially the middle section of copper-clad laminate (10a) in the present embodiment, the opening diameter of through-hole (13a) tends to be the smallest in substantially the middle section of copper-clad laminate (10a).

As a result, the diameter of through-hole (13a) of the present embodiment decreases from the first surface of copper-clad laminate (10a) toward reinforcing material 14 positioned at substantially the middle section of the inside; and the opening diameter increases from its smallest point toward the second surface, as shown in FIG. 1D.

In addition, instead of making a gradual change, the opening diameter of through-hole (13a) is preferred to make a notable change where reinforcing material 14 is located. Also, at the position where the opening diameter of through-hole (13a) becomes the smallest, part of reinforcing material 14 (protruding portion (140)) protrudes from resin 15.

As such, in the present embodiment, there is protruding portion 140 of reinforcing material 14, which protrudes into through-hole (13a) in substantially the middle section of copper-clad laminate (10a).

Accordingly, through-hole (13a) of the present embodiment tends to be configured with different levels in substantially the middle section (where reinforcing material (14) is located) of copper-clad laminate (10a) (see FIG. 1D).

As shown in FIG. 1D, the smallest diameter of through-hole (13a) (opening diameter (D2) formed in reinforcing material 14) and opening diameter (D1) formed in resin 15 at the same location are preferred to satisfy the following: $D2/D1=1/4 \sim 9/10$. If the ratio of D2/D1 is in such a range, through-hole (13a) may be filled with plating more easily.

The length of protruding portion 140 may be changed, for example, by adjusting beaming energy or laser density, number of laser shots or the like.

In the following, a treatment (desmearing treatment) is conducted to remove smears or the like remaining on the inner surface of through-hole (14a). Such a desmearing treatment is conducted using permanganate. Specifically, first, a conditioning (resin swelling) treatment is conducted on copper-clad laminate (10a) shown in FIG. 1D. After that, the laminate is immersed for 5-30 minutes in a 50-80° C. desmearing solution containing permanganate 40-80 g/l. Then, the laminate is washed with water, immersed in a neutralizer solution, washed with water and dried. As a result, smears are removed from the inner surface of through-hole (13a), and a clean surface will be exposed.

After the desmearing treatment, a conditioning treatment and a soft-etching (also referred to as micro-etching) are conducted on copper-clad laminate (10a). Then, the laminate is immersed in a catalyst solution containing alkaline palladium complex ions so that a catalyst, which initiates electroless plating (such as electroless copper plating or electroless nickel plating), adheres to both main surfaces of copper-clad laminate (10a) and the inner surface of through-hole (13a).

Figure 1E:
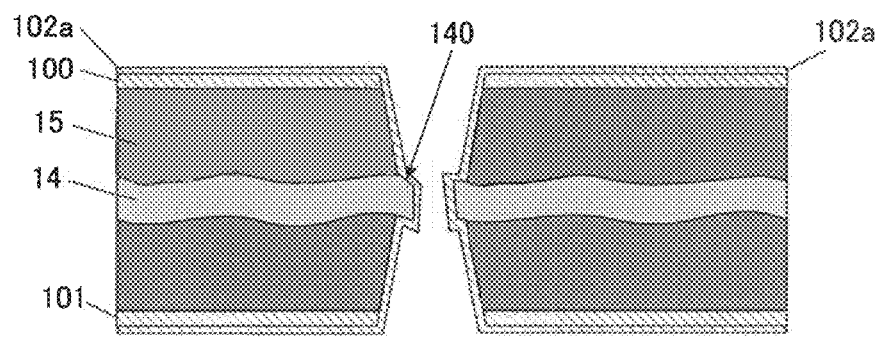
Figure 1F:
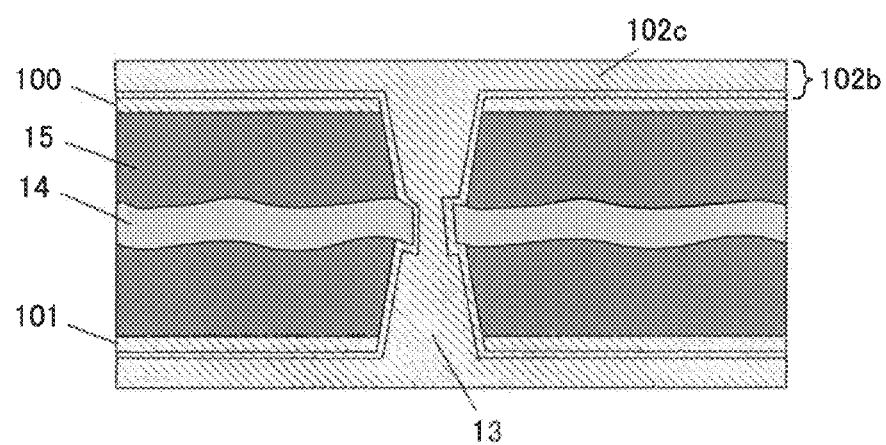
Figure 1G:
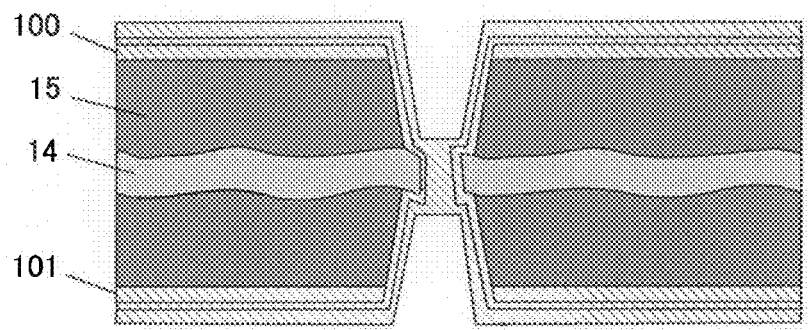

Then, when copper-clad laminate (10a) with adhered catalyst is immersed in an electroless plating solution, a substrate is obtained where electroless plated film (such as electroless copper-plated film or electroless nickel-plated film) (102a) is formed on both of its surfaces and on the inner surface of through-hole (13a), as shown in FIG. 1E.

In addition, during such time, electroless plated film (102a) is also deposited on protruding portion 140, which protrudes from the wall surface of resin 15 into through-hole (13a) in the middle section of through-hole (13a).

In the following, electrolytic plating treatment (for example, electrolytic copper plating treatment or electrolytic nickel plating treatment) is performed using electroless plated film (102a) as the seed layer to fill through-hole (13a) with plating (for example, electrolytic copper-plated film or electrolytic nickel-plated film) (102c). Accordingly, through-hole conductor (made up of an electroless plated film and an electrolytic plated film on the electroless plated film) (13) is formed (see FIG. 1F). Also, at that time, on both main surfaces of the substrate, electrolytic plated film (102c) is formed on electroless plated film (102a) so that plated film (102b) made up of electroless plated film (102a) and electrolytic plated film (102c) is formed, for example.

In the present embodiment, protruding portion 140 is formed, which protrudes from resin 15 into through-hole (13a) as shown in FIG. 1D. Thus, in the area where protruding portion 140 is formed, the opening diameter of through-hole (13a) tends to become the smallest. Also, as shown in FIG. 1E, on the surfaces of resin 15 exposed by through-hole (13a) and protruding portion 140 (namely, on the inner wall of through-hole (13a)), electroless plated film (102a) is formed. When filling through-hole (13a) with electrolytic plating, electroless plated film (102a) works as the seed layer. In the present embodiment, while performing electrolytic plating, plated film tends to be filled first in the space formed by the inner wall of protruding portion 140 (see FIG. 1G). After that, through-hole (13a) is filled with electrolytic plated film from where protruding portion 140 is located toward the first surface and second surface of the substrate.

As described above, because of protruding portion 140 which protrudes from the inner wall of through-hole (13a), through-hole (13a) is filled with plating starting in the narrowest portion (where the protruding portion is located). Also, in the present embodiment, since copper-clad laminate (10a) containing a sheet of reinforcing material 14 is used, protruding portion 140, which protrudes from the inner wall of through-hole (13a), is concentrated in one area (a middle section of the substrate). Thus, in through-hole (13a), multiple portions will not be blocked by plating at the same time. In addition, since the volume of the space formed by the inner wall of protruding portion 140 is small, voids seldom occur in the area having the smallest opening diameter (the space formed by the inner wall of protruding portion 140). Accordingly, it will be easier to fill through-hole (13a) with plating from the middle section of the substrate toward its first surface and second surface.

In the present invention, reinforcing material 14 is positioned in substantially the middle section of the substrate, and protruding portion 140 is also positioned in substantially the middle section of the substrate. Therefore, filling with plating will progress from the middle section of the substrate toward its first surface and second surface almost at the same time. As a result, plated film (102b) formed on the first surface and the second surface of the substrate tend to become thinner. Accordingly, later processes such as etching will become easier, and conductive circuits may be more finely formed more easily.

Figure 1H:
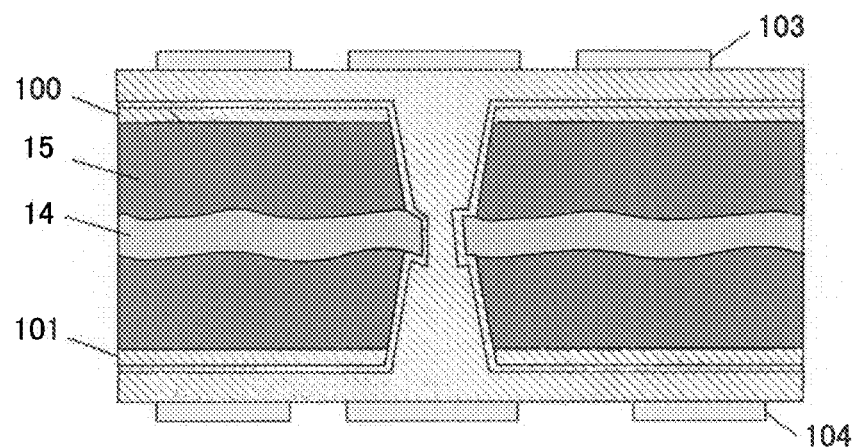

In the following, as shown in FIG. 1H, etching resists 103, 104 to protect conductive patterns that need to remain are formed on the surfaces of plated films (such as copper-plated films) (102b).

Figure 1I:
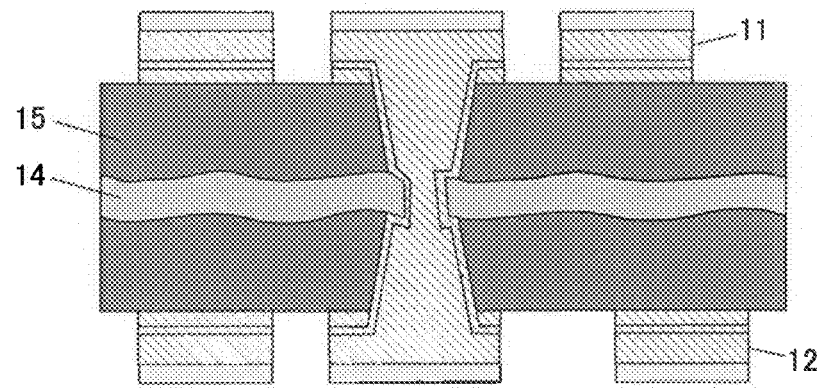

Then, plated films (102b) and copper foils (100, 101) exposed through etching resists 103, 104 are etched to form conductive circuits 11, 12 (see FIG. 1I).

Figure 2:
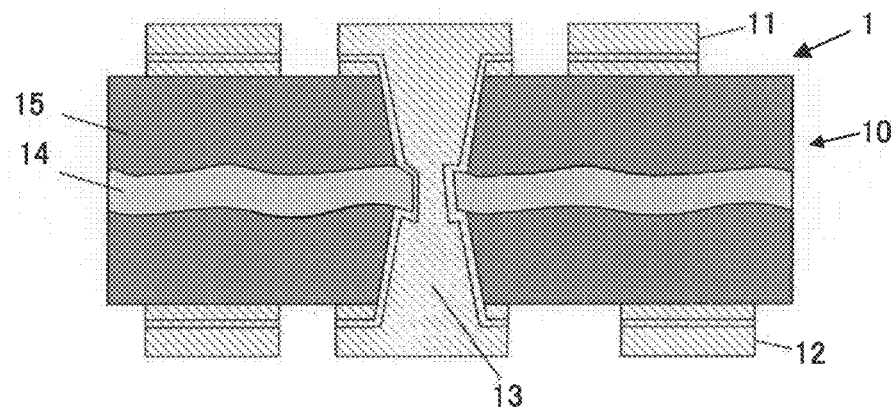
FIG. 2 is a cross-sectional view of a printed wiring board according to Embodiment 1.

Printed wiring board (1) as shown in FIG. 2 is obtained by conducting a step to remove etching resists 103, 104 after etching.

Printed wiring board 1 manufactured according to the present embodiment as above has the following excellent features, other than features such as described above in which the occurrence of voids in through-hole conductor 13 is notably suppressed.

Since through-hole conductor 13 is configured to taper toward the middle section of printed wiring board 1, its mechanical connection strength with insulative substrate 10 is high.

Since protruding portion 140 (part of reinforcing material 14), which protrudes from resin 15, encroaches into the middle section of through-hole conductor 13, tensile stresses in through-hole conductor 13 in a vertical direction may be eased efficiently. Thus, the connection strength between insulative substrate 10 and through-hole conductor 13 increases even more.

Figure 3:
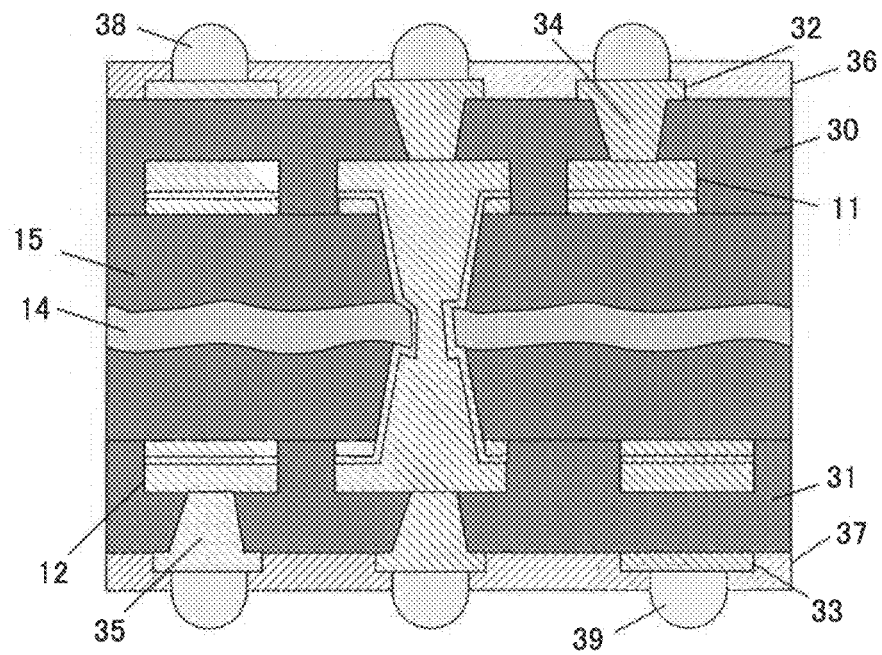
FIG. 3 is a cross-sectional view of a built-up multilayer printed wiring board using the printed wiring board shown in FIG. 2.

Such printed wiring board 1 is used as a core substrate of a multilayer printed wiring board. FIG. 3 shows an example of a built-up multilayer printed wiring board in which printed wiring board 1 shown in FIG. 2 is used as a core substrate. The method for manufacturing such a built-up multilayer printed wiring board is briefly described below.

First, on the first and second surfaces of printed wiring board 1 of FIG. 2, interlayer resin insulation layers 30, 31 are formed respectively. Then, opening portions reaching conductive circuits 11, 12 formed in printed wiring board 1 are formed in interlayer resin insulation layers 30, 31 After that, conductive circuits 32, 33 are formed on interlayer resin insulation layers 30, 31 respectively. Simultaneously during that time, via conductors 34, 35 are formed in the opening portions of interlayer resin insulation layers 30, 31 respectively. In doing so, conductive circuit 11 and conductive circuit 32 are electrically connected by via conductor 34; and conductive circuit 12 and conductive circuit 33 are electrically connected by via conductor 35.

In the following, a liquid or dry-film photosensitive resist (solder resist) is applied or laminated on both main surfaces of the substrate. Here, a thermosetting solder resist may also be used.

Then, mask film with a predetermined pattern is adhered to the surfaces of the photosensitive resists, which are exposed to ultraviolet rays and developed with an alkaline solution.

As a result, solder resist layers 36, 37 are formed having opening portions to expose areas which will become solder pads of conductive circuits 32, 33.

The opening portions in solder resist layers 36, 37 may be those which partially expose the top surfaces of via conductors 34, 35. Alternatively, such opening portions may also be those that expose the entire top surfaces of via conductors 34, 35 and part of conductive circuits 32, 33 directly connected to via conductors 34, 35.

In the following, solder paste is printed on the solder pads and reflowed to form solder bumps 38, 39. The built-up multilayer printed wiring board of FIG. 3 manufactured as such will be electrically connected to electronic components such as an IC chip or to a daughterboard or the like by means of solder bumps 38, 39.

In the present embodiment, copper-clad laminate (10a) containing a sheet of reinforcing material 14 is used, and reinforcing material 14 is positioned in substantially the middle section of insulative substrate 10. Also, in the middle region of through-hole conductor 13, protruding portion 140 of reinforcing material (14b), which protrudes from the inner wall, encroaches into through-hole conductor 13.

However, the arrangement of reinforcing material 14, the configuration of through-hole conductor 13 and so forth are not limited to anything specific. In short, it is sufficient if protruding portion 140 is located at the intersection of first opening 201 and second opening 202. Because of reinforcing material 14 located at the intersection of first opening 201 and second opening 202, the opening diameter at the intersection may become the smallest diameter of through-hole (13a). Also, at the longitudinal cross-section of through-hole (13a), the number of spots where the opening diameter becomes the smallest tends to be one.

Embodiment 2

Figure 4:
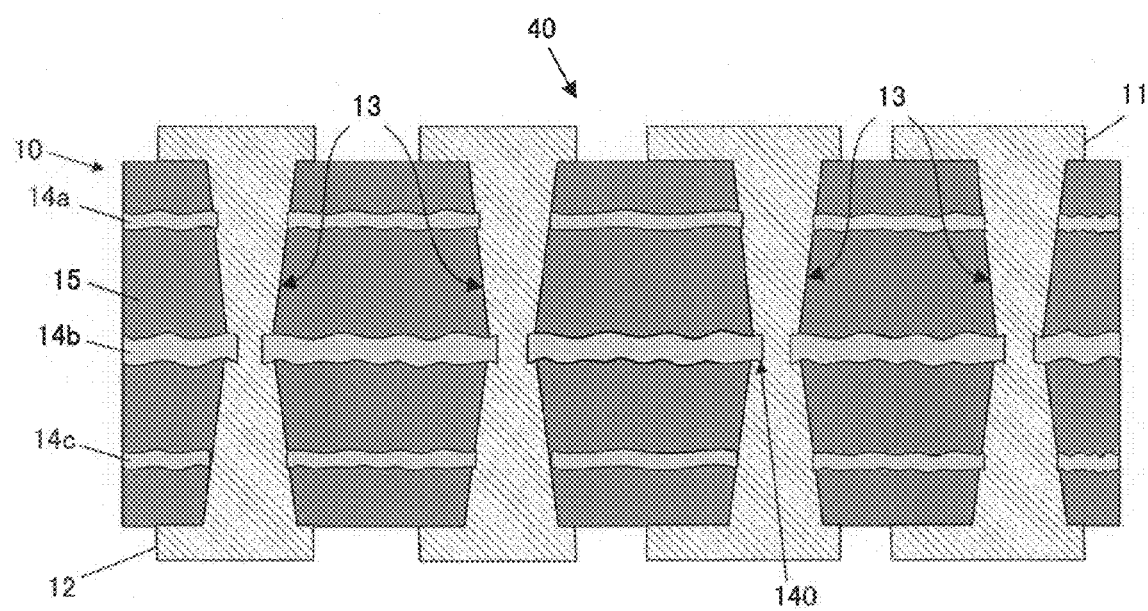
FIG. 4 is a cross-sectional view of a printed wiring board according to Embodiment 2 of the present invention.

FIG. 4 shows a cross-sectional view of printed wiring board 40 according to Embodiment 2. In printed wiring board 40, insulative substrate 10 is formed with three sheets of reinforcing material (14a, 14b, 14c) and cured resin 15. Reinforcing material (14b) is positioned at substantially the middle section of insulative substrate 10; reinforcing material (14a) is positioned between the middle section of insulative substrate 10 and the first surface; and reinforcing material (14c) is positioned between the middle section of insulative substrate 10 and the second surface. Also, part of reinforcing material (14b) (protruding portion 140) encroaches into each through-hole conductor 13.

Figure 5A:
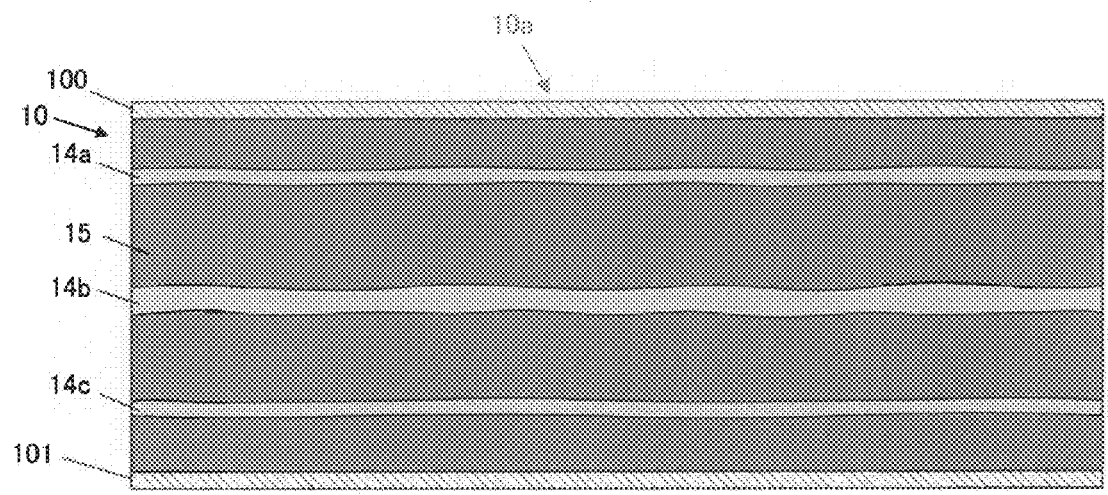
FIGS. 5A-5F are cross-sectional views showing the steps of manufacturing a printed wiring board according to Embodiment 2.

The method for manufacturing printed wiring board 40 is described with reference to FIGS. 5A-5F. First, copper-clad laminate (10a) is prepared where copper foils 100, 101 with a thickness of 12 μm are laminated on both main surfaces of insulative substrate 10 with an approximate thickness of 0.4 mm as shown in FIG. 5A. In the present embodiment, insulative substrate 10 is a substrate made by impregnating three sheets of reinforcing material 14 with resin and curing the resin. The three sheets of reinforcing material 14 are each arranged substantially parallel to the main surfaces of copper-clad laminate (10a).

In the following, alignment marks (not shown in the drawings) penetrating copper-clad laminate (10a) are formed. Then, copper foils 100, 101 of copper-clad laminate (10a) are oxidized using a black oxide treatment.

Figure 5B:
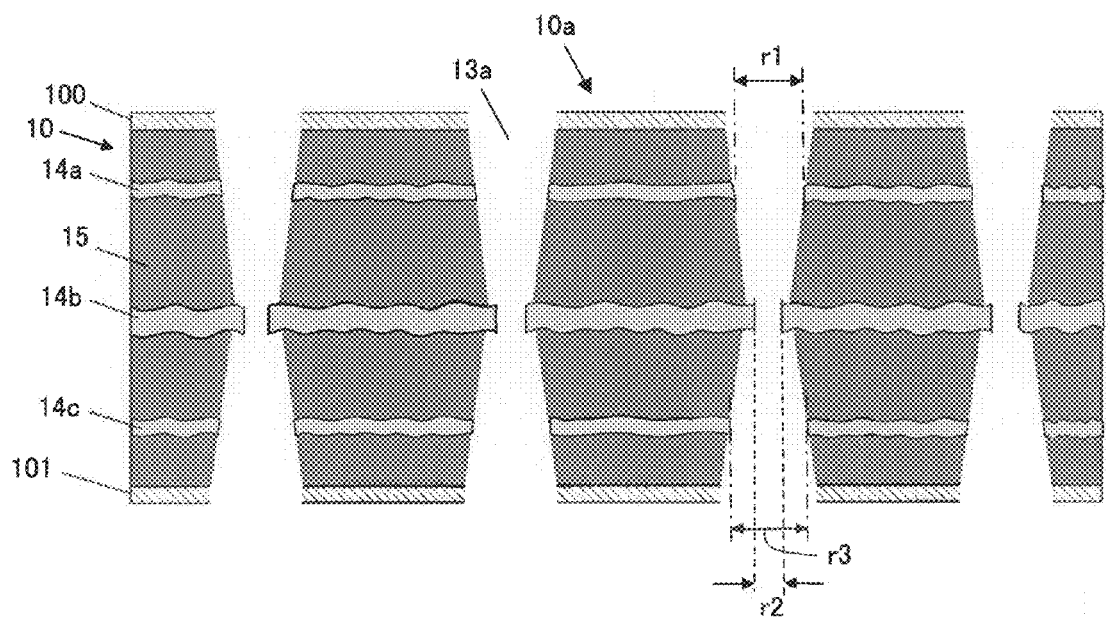

In the following, at predetermined spots of copper-clad laminate (10a), through-holes (13a) made up of a first opening and a second opening are formed (see FIG. 5B). The first opening tapers from the first surface of copper-clad laminate (10a) toward the second surface; and the second opening tapers from the second surface of copper-clad laminate (10a) toward the first surface. The method for forming through-holes (13a) is the same as that of Embodiment 1.

In the present embodiment, reinforcing material (14b) is located at the intersection of the first and second openings. Namely, through-hole (13a) has part of reinforcing material (14b) (protruding portion) at the intersection of the first and second openings. Also, at the intersection of the first and second openings, the opening diameter of through-hole (13a) is the smallest. Here, reinforcing materials (14a, 14c) may also have protruding portions that protrude from resin 5 into through-hole (13a). However, the opening diameter (r1) of the opening formed in reinforcing material (14a) is larger than the opening diameter (r2) of the opening formed in reinforcing material (14b). In addition, the opening diameter (r3) of the opening formed in reinforcing material (14c) is also larger than (r2).

As for a method for forming through-holes that satisfy both formulas (r1)>(r2) and (r3)>(r2), for example, a method is listed in which first and second openings are formed by a laser beam with a higher-energy density at its center than at its peripheries. Also, by changing the thicknesses of reinforcing materials 14, through-holes may also be formed to satisfy formulas both (r1)>(r2) and (r3)>(r2). Specifically, the thickness of reinforcing material (14b) is made greater than the thicknesses of reinforcing materials (14a, 14c), which are positioned above and below reinforcing material (14b). In the present embodiment, the thicknesses of reinforcing materials (14a, 14c) are made thinner than the thickness of reinforcing material (14b).

In such a case, the thickness of reinforcing material (14b) is in the range of 0.12-0.15 mm, and the thicknesses of reinforcing materials (14a, 14c) are preferred to be in the range of 0.09-0.12 mm. The thickness difference between reinforcing material (14b) and reinforcing materials (14a, 14c) is preferred to be in an approximate range of 0.015-0.05 mm.

Figure 5C:
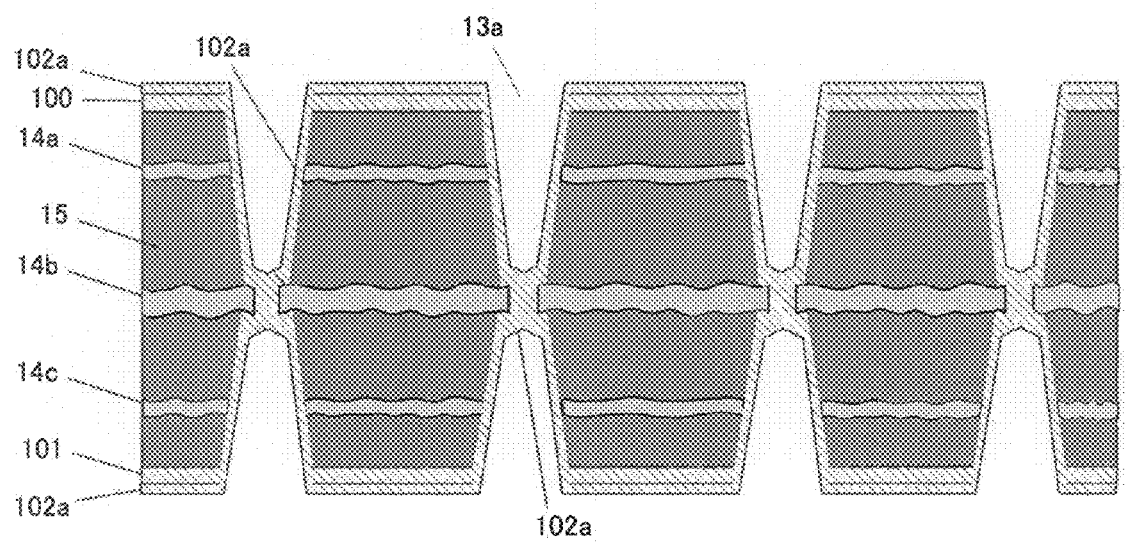
Figure 5D:
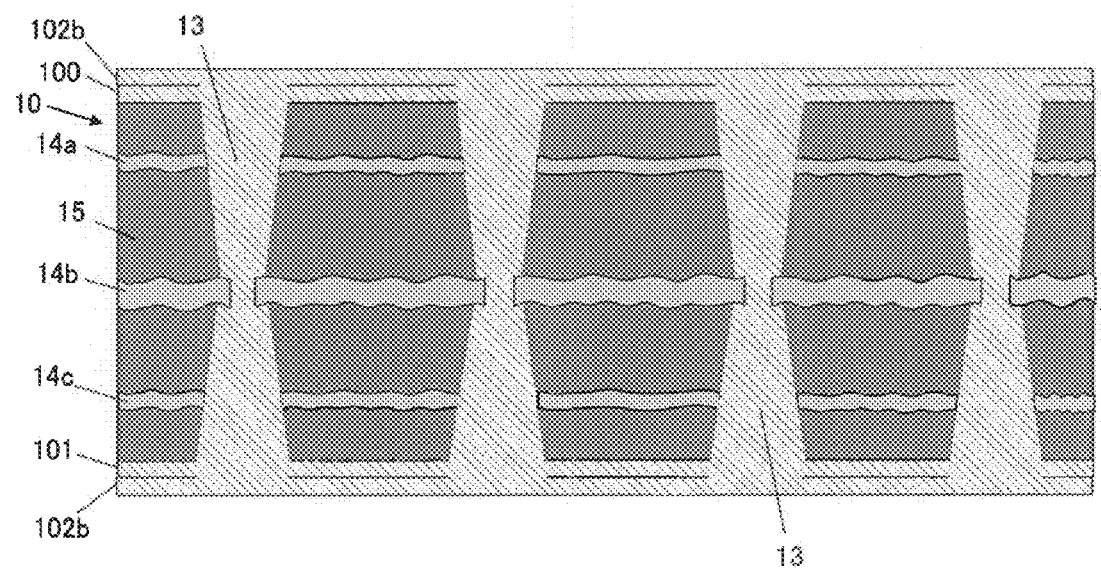
Figure 5E:
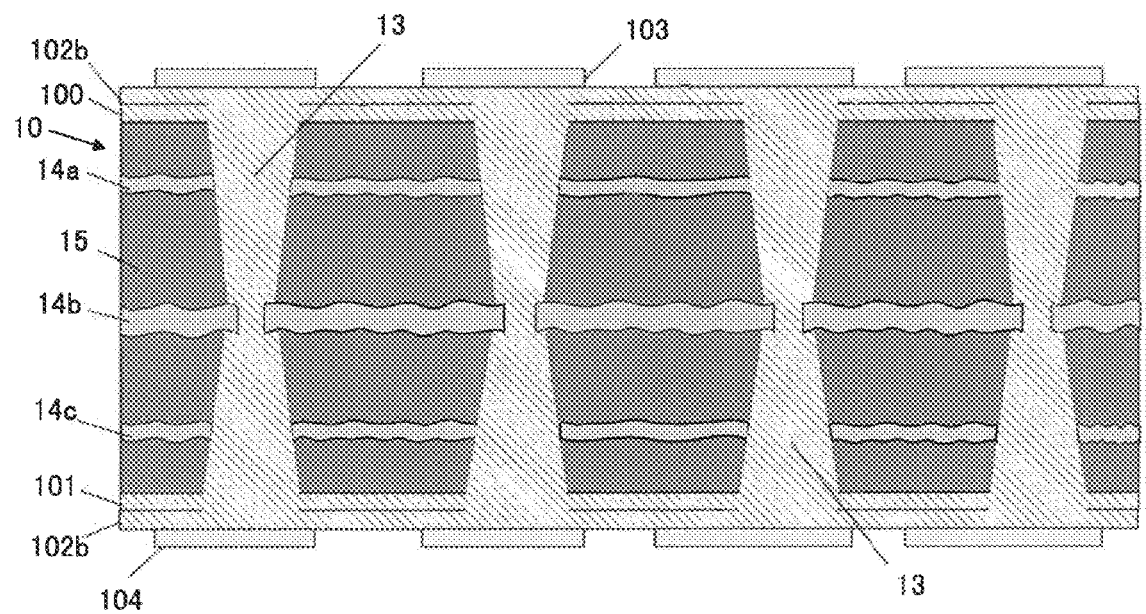

After forming through-holes (13a), electroless plated film (102a) is formed on both main surfaces of copper-clad laminate (10a) and inner walls of through-holes (13a) (see FIG. 5C). In doing so, the spaces formed by the inner walls of reinforcing material (14b) are filled with electroless plated film (102a). After electroless plated film (102a) is formed, an electrolytic plating treatment is performed to form plated film (102b) and through-hole conductor 13 (see FIG. 5D). Then, as shown in FIG. 5E, etching resists 103, 104 to protect conductive patterns that need to remain are formed on the surface of plated film (102b).

Figure 5F:
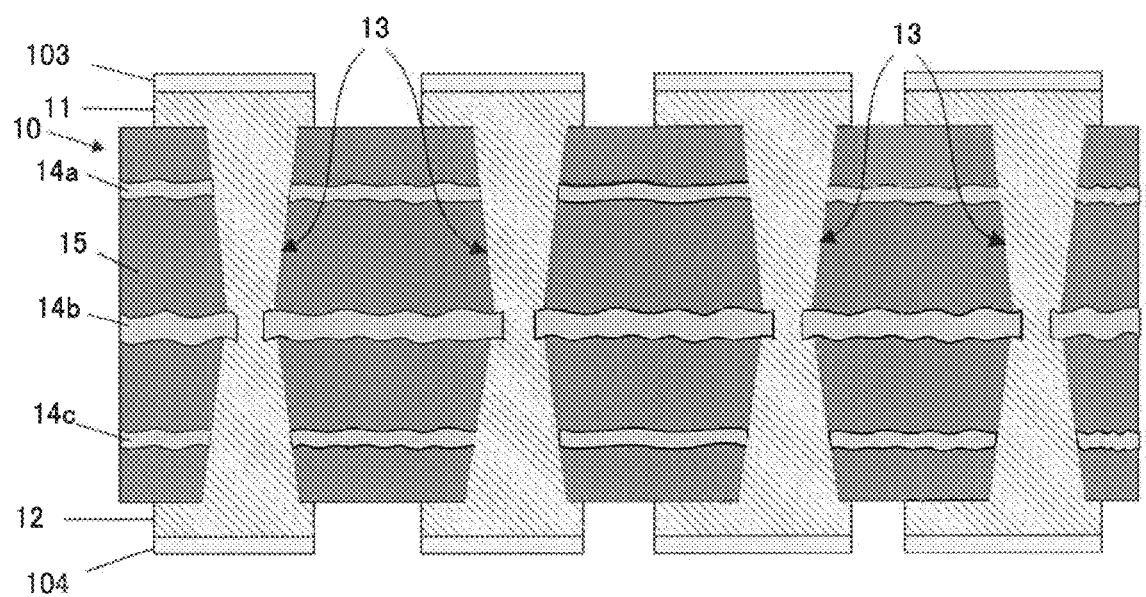

Then, plated film (102b) and copper foils 100, 101 exposed through etching resists 103, 104 are etched to form conductive circuits 11, 12 (see FIG. 5F). After etching, by conducting a step to remove the etching resists, printed wiring board 40 is obtained as shown in FIG. 4.

Printed wiring board 40 of the present embodiment as manufactured above has an increased substrate strength, since it has three sheets of reinforcing material. Also, since printed wiring board 40 of the present embodiment uses an odd number of sheets of reinforcing material 14, the same as in printed wiring board 1 of Embodiment 1, it is easier to arrange reinforcing material 14 in the middle section of insulative substrate 10. As a result, the through-hole diameter tends to be smallest in the middle section of insulative substrate 10. Moreover, by arranging reinforcing material 14 in the middle section of insulative substrate 10, printed wiring board 40 becomes well balanced in the direction of its thickness, thus warping of the substrate may be suppressed.

Figure 6:
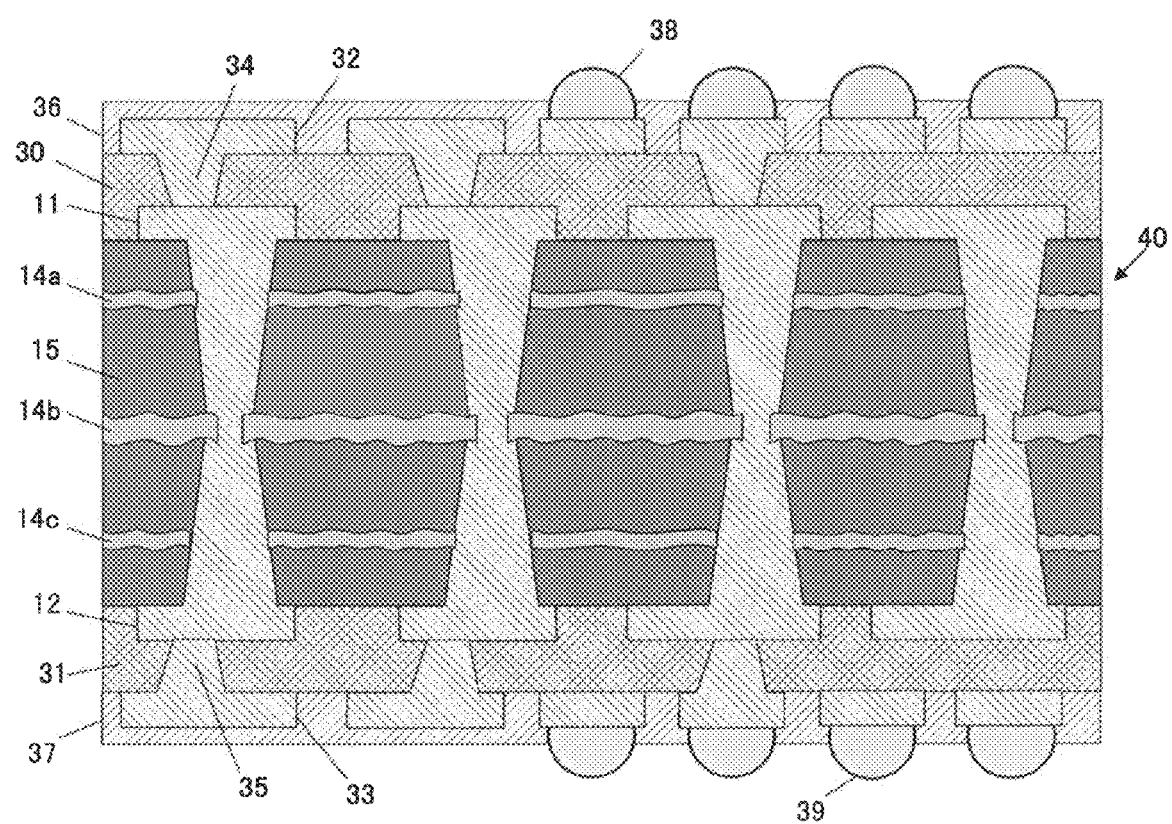
FIG. 6 is a cross-sectional view of a built-up multilayer printed wiring board using the printed wiring board shown in FIG. 4.

Also, by using printed wiring board 40 as a core substrate and forming built-up layers, a multilayer printed wiring board as shown in FIG. 6 may be obtained.

The present invention is not limited to above embodiments, but various modifications may be made within a scope that will not deviate from the gist of the present invention.

FIGS. 7A-7D show cross-sectional views of essential parts of other embodiments after electroless plated films (102a) are formed.

Figure 7A:
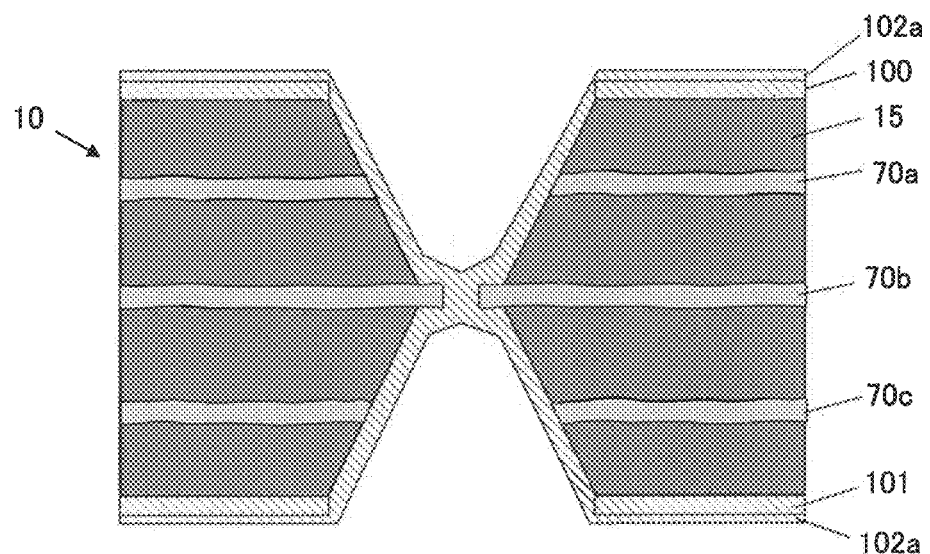
FIGS. 7A-7D are cross-sectional views each showing the state of an essential part patterns 1-4 in other embodiments after electroless plated film is formed.
Figure 7B:
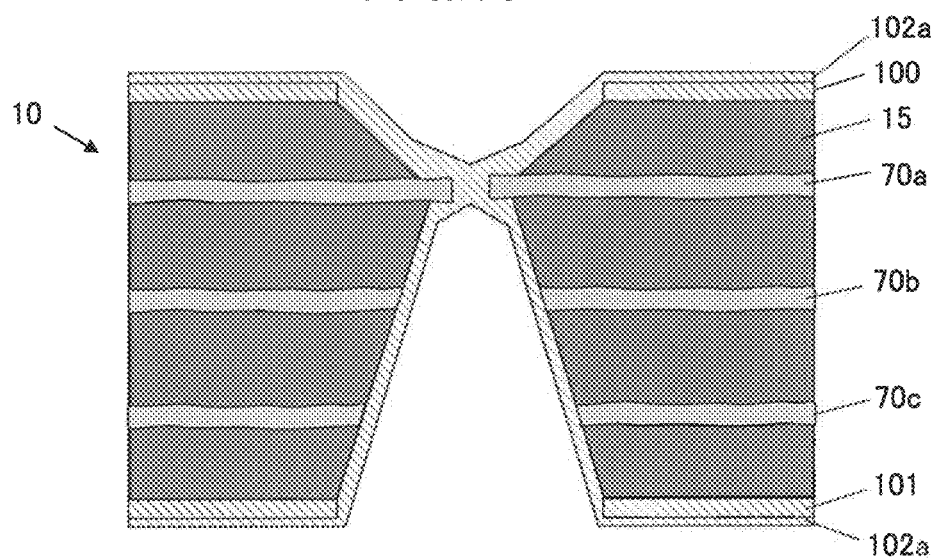

In FIGS. 7A and 7B, insulative substrate 10 contains three sheets of reinforcing material (70a-70c), and the thickness of each sheet of reinforcing material 70 is the same (for example, 100 μm).

Figure 7C:
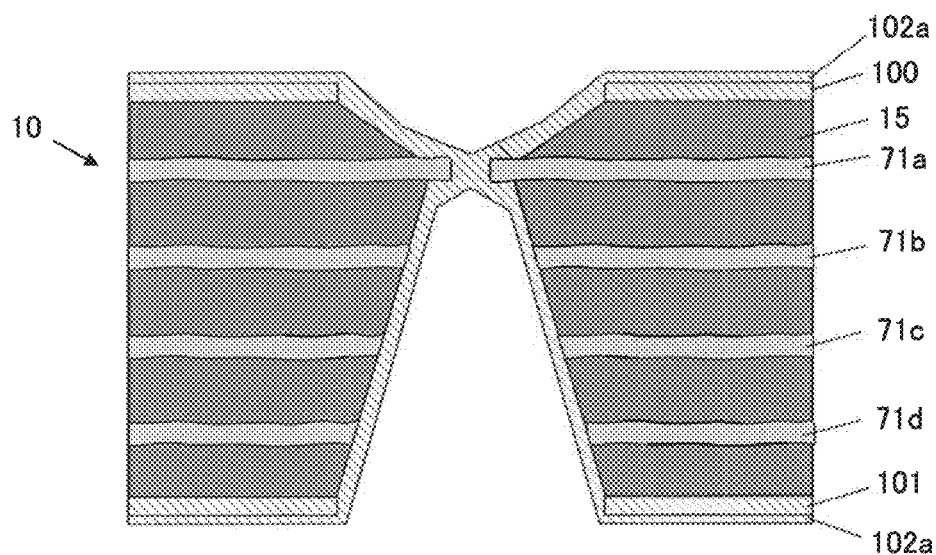
Figure 7D:
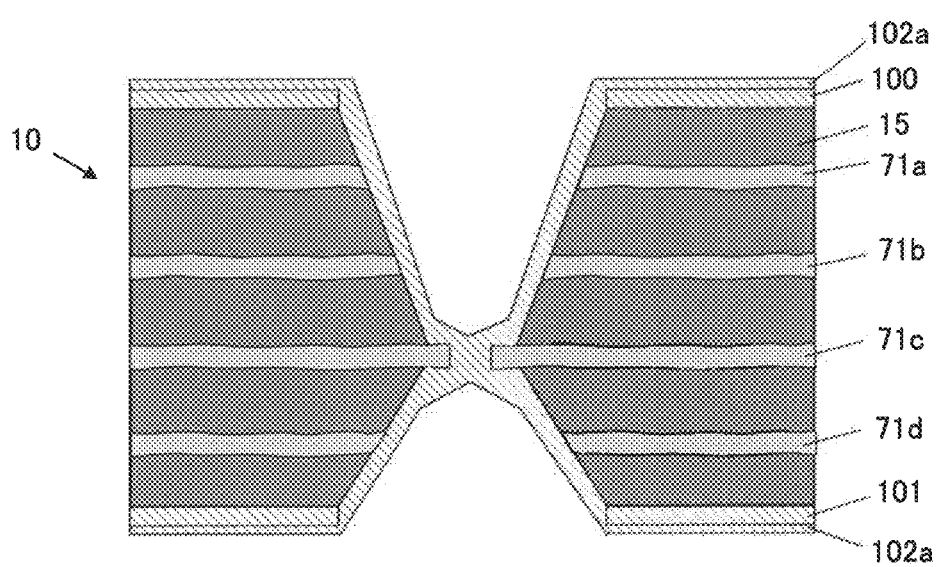
Figure 8A:
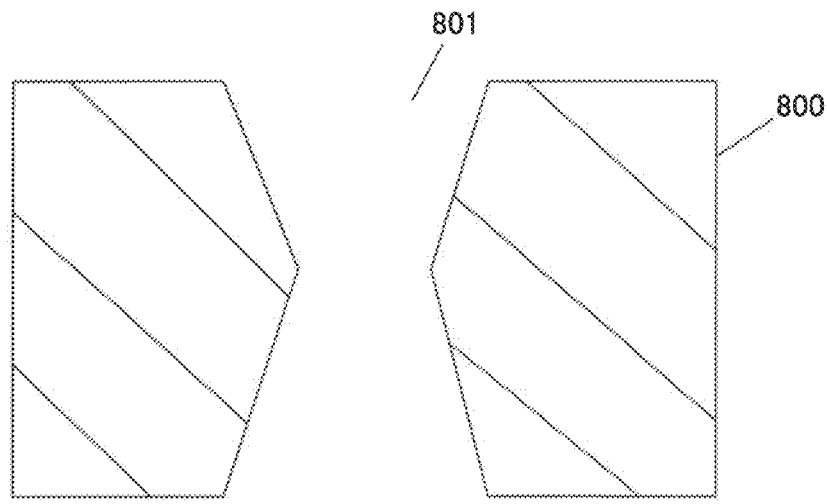
FIG. 8A is a cross-sectional view showing a through-hole with a hand-drum shape in prior art.
Figure 8B:
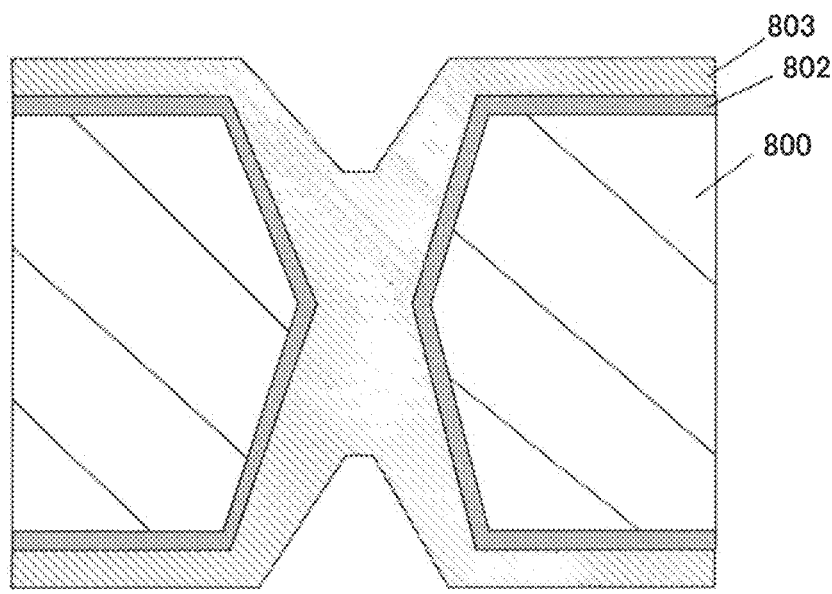
FIG. 8B is a cross-sectional view showing a state after metal is filled in the through-hole shown in FIG. 8A.
Figure 9A:
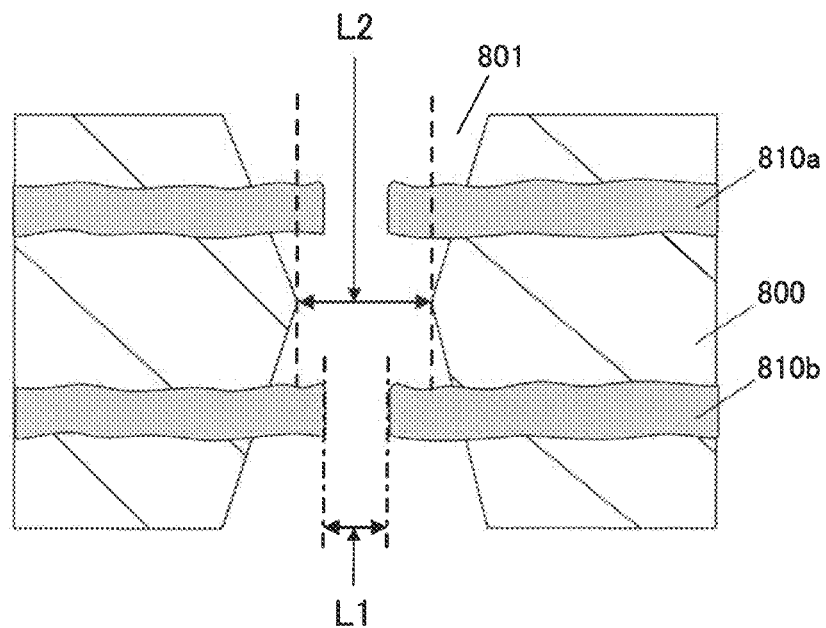
FIG. 9A is a view illustrating what is considered to be a problem of the prior art, showing a cross-sectional view after the through-hole is formed.
Figure 9B:
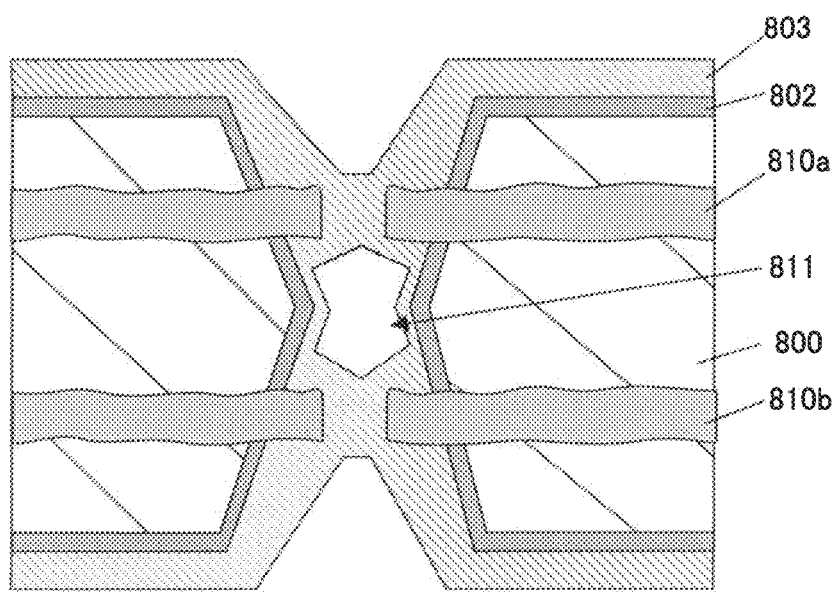
FIG. 9B is a cross-sectional view showing the state after metal is filled in the through-hole shown in FIG. 9A.

In FIGS. 7C and 7D, insulative substrate 10 contains four sheets (namely, an even number of sheets) of reinforcing material (71a-71d), and the thickness of each sheet of reinforcing material 71 is the same (for example, 100 μm).

The smallest diameter of each through-hole in FIGS. 7A-7D is at the intersection of the first and second openings, and the reinforcing material protrudes into the through-hole at such an intersection.

In FIGS. 7B, 7C and 7D, the areas where opening diameters of through-holes become the smallest are not positioned in substantially the middle section of their respective substrates. In FIGS. 7B and 7C, the intersection is positioned between the middle section of the substrate and the first surface; and in FIG. 7D, the intersection is positioned between the middle section of the substrate and the second surface.

As such, a printed wiring board where the intersection is positioned between the middle section of the substrate and either the first surface or the second surface of the substrate may be used preferably as a core substrate for the built-up multilayer printed wiring board shown in FIG. 3 or FIG. 6. That is because the stress added onto the bent portions of through-holes is reduced. However, in such a case, it is more preferable that the number of sheets of reinforcing material be an even number.

A printed wiring board according to one aspect of the present invention includes the following: a substrate having a first surface, a second surface opposite the first surface, and a through-hole made up of a first opening tapering from the first surface toward the second surface and of a second opening tapering from the second surface toward the first surface; a first conductive circuit formed on the first surface of the substrate; a second conductive circuit formed on the second surface of the substrate; and a through-hole conductor filled in the through-hole and connecting the first conductive circuit and the second conductive circuit. In such a printed wiring board, the substrate is made of a reinforcing material and resin, and at the portion where the first opening and the second opening intersect, part of the reinforcing material protrudes from the wall surface of the resin into the through-hole, and the protruding portion of the reinforcing material encroaches into the through-hole conductor.

In addition, a method for manufacturing a printed wiring board according to another aspect of the present invention has the following steps: a step to prepare a substrate made of a reinforcing material and resin and having a first surface and a second surface opposite the first surface; a step to form a first opening tapering from the first surface of the substrate toward the second surface; by forming a second opening tapering from the second surface of the substrate toward the first surface, a step to form a through-hole made up of the first opening and the second opening; a step to form a through-hole conductor by filling the through-hole with plating; and a step to form conductive circuits on the first surface and the second surface of the substrate which are connected by the through-hole conductor. According to such a manufacturing method, in the step to form a through-hole, the through-hole is formed in such a way that the reinforcing material protrudes from the wall surface of the resin into the through-hole at the intersection of the first opening and second opening; and in a step to form a through-hole conductor, through-hole is filled with plating from the intersection toward the first and second surfaces of the substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board comprising:
a substrate having a first surface, a second surface on an opposite side of the first surface, and a through-hole extending between the first surface and the second surface; a first conductive circuit formed on the first surface of the substrate; a second conductive circuit formed on the second surface of the substrate; and a through-hole conductor filling the through-hole and connecting the first conductive circuit and the second conductive circuit, wherein the through-hole has a first opening portion tapering from the first surface toward the second surface and a second opening portion tapering from the second surface toward the first surface, the substrate comprises a resin and a reinforcing material portion provided in the resin, the reinforcing material portion has a protruding portion protruding from the resin and protruding into the through-hole at an intersection of the first opening portion and the second opening portion, and the protruding portion of the reinforcing material portion encroaches into the through-hole conductor.

2. The printed wiring board according to claim 1, wherein the first opening portion and the second opening portion intersect at substantially a middle section of the substrate in a direction of thickness.

3. The printed wiring board according to claim 1, wherein the reinforcing material portion comprises at least one of glass cloth, glass non-woven cloth and aramid non-woven cloth.

4. The printed wiring board according to claim 1, wherein the reinforcing material portion is formed with a plurality of reinforcing material sheets, and one of the reinforcing material sheets is positioned in substantially a middle section of the substrate in a direction of thickness.

5. The printed wiring board according to claim 4, wherein the plurality of reinforcing material sheets comprises an odd number of the reinforcing material sheets.

6. The printed wiring board according to claim 1, wherein the through-hole conductor comprises copper plating.

7. A method for manufacturing a printed wiring board, comprising: preparing a substrate comprising a resin and a reinforcing material portion provided in the resin; forming a first opening portion tapering from a first surface of the substrate toward a second surface on an opposite side of the substrate; forming a second opening portion tapering from the second surface of the substrate toward the first surface such that the first opening portion and the second opening portion is connected to form a through-hole having the first opening portion and the second opening portion and the reinforcing material portion has a protruding portion protruding from the resin and protruding into the through-hole at an intersection of the first opening portion and the second opening portion; forming a through-hole conductor by filling the through-hole with a conductive material; and forming a first conductive circuit on the first surface of the substrate and a second conductive circuit on the second surface of the substrate such that the first conductive circuit and the second conductive circuit are connected by the through-hole conductor.

8. The method for manufacturing a printed wiring board according to claim 7, wherein the preparing comprises positioning the reinforcing material portion in substantially a middle section of the substrate in a direction of thickness.

9. The method for manufacturing a printed wiring board according to claim 7, wherein the preparing comprises forming the reinforcing material portion comprising at least one of glass cloth, glass non-woven cloth and aramid non-woven cloth.

10. The method for manufacturing a printed wiring board according to claim 7, wherein the preparing comprises forming the reinforcing material portion with a plurality of reinforcing material sheets, and positioning one of the reinforcing material sheets in substantially a middle section of the substrate in a direction of thickness.

11. The method for manufacturing a printed wiring board according to claim 10, wherein the plurality of reinforcing material sheets comprises an odd number of the reinforcing material sheets.

12. The method for manufacturing a printed wiring board according to claim 7, wherein the forming of the through-hole conductor comprises forming an electroless plated film on a side wall of the through-hole and an electrolytic plated film on the electroless plated film.

13. The method for manufacturing a printed wiring board according to claim 12, wherein the electroless plated film is electroless copper-plated film and the electrolytic plated film is electrolytic copper-plated film.

14. The method for manufacturing a printed wiring board according to claim 7, wherein the forming of the first opening portion comprises forming the first opening portion based on an alignment mark, and the forming of the second opening portion comprises forming the second opening portion based on the alignment mark used in the forming of the first opening portion.

15. The method for manufacturing a printed wiring board according to claim 12, wherein the forming of the through-hole conductor comprises plating the conductor material from the intersection of the first and second opening portions toward the first surface and the second surface of the substrate.

16. The printed wiring board according to claim 1, wherein the reinforcing material portion is a sheet of a reinforcing material.

17. The printed wiring board according to claim 1, wherein the reinforcing material portion forms a layer of a reinforcing material.

18. The printed wiring board according to claim 1, wherein the reinforcing material portion is a sheet of a reinforcing material and is positioned in substantially a middle section of the substrate in a direction of thickness.

19. The method for manufacturing a printed wiring board according to claim 7, wherein the reinforcing material portion is a sheet of a reinforcing material.

20. The method for manufacturing a printed wiring board according to claim 7, wherein the reinforcing material portion forms a layer of a reinforcing material.

* * * * *